(12) United States Patent
Huang et al.

(10) Patent No.: US 12,095,454 B2
(45) Date of Patent: Sep. 17, 2024

(54) ELECTRONIC SWITCH DEVICE AND SYSTEM THEREOF

(71) Applicant: DARWIN PRECISIONS CORPORATION, Hsinchu County (TW)

(72) Inventors: Chia-Tsun Huang, Hsinchu County (TW); Keng-Kuei Liang, Hsinchu County (TW); chih-Hung Liu, Hsinchu County (TW); Yi-Feng Chen, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 21 days.

(21) Appl. No.: 18/128,266

(22) Filed: Mar. 30, 2023

(65) Prior Publication Data
US 2024/0162903 A1 May 16, 2024

(30) Foreign Application Priority Data

Nov. 15, 2022 (TW) .................................. 111143501

(51) Int. Cl.
*H03K 17/96* (2006.01)
*G06F 3/041* (2006.01)
*H03K 5/24* (2006.01)

(52) U.S. Cl.
CPC ............. *H03K 17/96* (2013.01); *G06F 3/041* (2013.01); *H03K 5/24* (2013.01); *G06F 2203/04105* (2013.01)

(58) Field of Classification Search
CPC ............. H03K 17/96; H03K 17/9622; H03K 17/9625; H03K 17/9629; H03K 2217/9651
See application file for complete search history.

(56) References Cited

U.S. PATENT DOCUMENTS

| 5,038,142 | A | * | 8/1991 | Flower | ................ G06F 3/04142 |
| | | | | | 345/173 |
| 10,599,248 | B2 | * | 3/2020 | Sah | ....................... G06F 3/03547 |
| 10,763,053 | B2 | * | 9/2020 | Kosugi | .................. H01H 13/52 |
| 2021/0194483 | A1 | * | 6/2021 | Cannon | .................... G06F 3/017 |

FOREIGN PATENT DOCUMENTS

| CN | 105975121 | * | 9/2016 |
| CN | 106775407 | A | 5/2017 |
| CN | 107272973 | A | 10/2017 |
| CN | 107728849 | A | 2/2018 |
| CN | 108108047 | A | 6/2018 |
| TW | 201222347 | A1 | 6/2012 |
| TW | M625711 | U | 4/2022 |

* cited by examiner

*Primary Examiner* — Sibin Chen

(57) ABSTRACT

An electronic switch device and an electronic switch system are provided, wherein the electronic switch system includes: an electronic switch device, which includes: a sensing module, which includes: a pressure sensing module for providing a pressure sensing signal; and a touch control sensing module disposed on the pressure sensing module for providing a touch control sensing signal; and a comparator circuit coupled to the sensing module for receiving the pressure sensing signal.

10 Claims, 4 Drawing Sheets

ELECTRONIC SWITCH DEVICE AND SYSTEM THEREOF

FIELD OF THE INVENTION

The invention relates to an electronic switch device and an electronic switch system, and more particularly, to an electronic switch device and an electronic switch system with the touch sensing function and multi-stage pressure sensing function.

BACKGROUND OF THE INVENTION

At present, switches with multi-stage pressure sensing functions are generally mechanical switches, which can be used to carry out single-stage or multi-stage pressure sensing functions. The multi-stage pressure sensing function refers to the function of switching the switch state in multiple stages according to the magnitude of user's pressure. However, due to the complex structure of mechanical switches, when the multi-stage pressure sensing function is realized by the mechanical structure alone, problems such as low life expectancy or low reliability may be encountered due to wearing of the mechanics.

The touch switch has the advantages of simple structure, no mechanical friction and so on. Compared with the mechanical switch, the touch switch may have a longer service life. However, it is difficult for the touch switch to realize the multi-stage pressure sensing function. For example, the pressure sensing functions so far are carried out via using a finger to touch a touch switch, and then convert the sensed parameters such as the capacitance, surface area, duration, etc. into a pressure sensing value, so as to simulate the pressure sensing function. However, because the finger size of different users can be different, the sensing parameters generated for these users will also be different. As mentioned above, the touch switch cannot accurately simulate the pressure sensing function corresponding to all users.

SUMMARY OF THE INVENTION

In view of this, the present invention provides an electronic switch device and an electronic switch system. The electronic switch system comprises an electronic switch device that comprises a comparator circuit. The electronic switch device comprises a sensing module that comprises a pressure sensing module and a touch sensing module. The electronic switch system of the present invention can provide a pressure sensing signal and a touch sensing signal respectively via the pressure sensing module and the touch sensing module when a user touches the electronic switch device, and then transmit the pressure sensing signal to the comparator circuit to realize the touch function and multi-stage pressure sensing function at the same time.

The electronic switch device provided by the invention comprises a sensing module that comprises a pressure sensing module for providing a pressure sensing signal, and a touch sensing module arranged on the pressure sensing module to provide a touch sensing signal. The sensing module is coupled with the comparator circuit, and the comparator circuit receives the pressure sensing signal.

In one embodiment of the present invention, the pressure sensing signal of the electronic switch device comprises a positive pressure sensing signal and a negative pressure sensing signal.

In an embodiment of the present invention, the pressure sensing module of the electronic switch device comprises a first axial pressure sensing unit for providing a pressure sensing signal according to a first axial direction, a second axial pressure sensing unit for providing a pressure sensing signal according to a second axial direction, and a third axial pressure sensing unit for providing a pressure sensing signal according to a third axial direction. The first axial direction, the second axial direction and the third axial direction are perpendicular to one another.

In an embodiment of the present invention, the sensing module of the electronic switch device is connected with an analog-to-digital conversion unit, which can receive the pressure sensing signal and convert the pressure sensing signal from an analog signal to a digital signal.

In an embodiment of the present invention, the sensing module of the electronic switch device is coupled to a logic circuit, and the logic circuit can receive a pressure sensing signal and a touch sensing signal and provide switch state data.

The electronic switch system provided by the present invention comprises an electronic switch device comprising a sensing module comprising a pressure sensing module for providing a pressure sensing signal, a touch sensing module arranged on the pressure sensing module to provide a touch sensing signal, and a comparator circuit coupled to the sensing module to receive the pressure sensing signal.

In one embodiment of the present invention, the pressure sensing signal in the electronic switch system comprises a positive pressure sensing signal and a negative pressure sensing signal.

In an embodiment of the present invention, the pressure sensing module in the electronic switch system comprises a first axial pressure sensing unit for providing a pressure sensing signal according to a first axial direction, a second axial pressure sensing unit for providing a pressure sensing signal according to a second axial direction, and a third axial pressure sensing unit for providing a pressure sensing signal according to a third axial direction. The first axial direction, the second axial direction and the third axial direction are perpendicular to one another.

In an embodiment of the present invention, the electronic switch system further comprises an analog-to-digital conversion unit connected to the sensing module for receiving the pressure sensing signal and converting the pressure sensing signal from an analog signal to a digital signal.

In an embodiment of the present invention, the electronic switch system further comprises a logic circuit coupled to the sensing module, and the logic circuit receives the pressure sensing signal and the touch sensing signal and provides switch state data.

To sum up, the electronic switch device and the electronic switch system provided of the present invention can provide a pressure sensing signal and a touch sensing signal respectively via the pressure sensing module and the touch sensing module when the user touches the electronic switch device, and then transmit the pressure sensing signal to the comparator circuit to realize the touch function as well as multi-stage pressure sensing function. According to the technical structure, the invention realizes the multi-stage pressure sensing function, while the problem of mechanical loss and reduced service life caused by using mechanical switches alone can be avoided, and the problem of the raised difficulty of simulating the pressure sensing function due to using touch switches alone can be also avoided. The design of the sensing module of the invention combines the touch sensing module and the pressure sensing module, thus eliminating the problem of mechanical loss and extending the service life. Because the design of the sensing module combines the touch sensing module and the pressure sensing module, the pressing contact surface of the electronic switch can be realized in a seamless manner, and the electronic switch is provided with the technical effects of waterproof, mistouch prevention, blind operation, multi-directional pressure sensing, etc.

In order to make the above and other objectives, features and advantages of the present invention more obvious and easier to understand, the following examples are given in detail with the accompanying drawings.

DETAILED DESCRIPTION OF PREFERRED EMBODIMENTS

Figure 1:
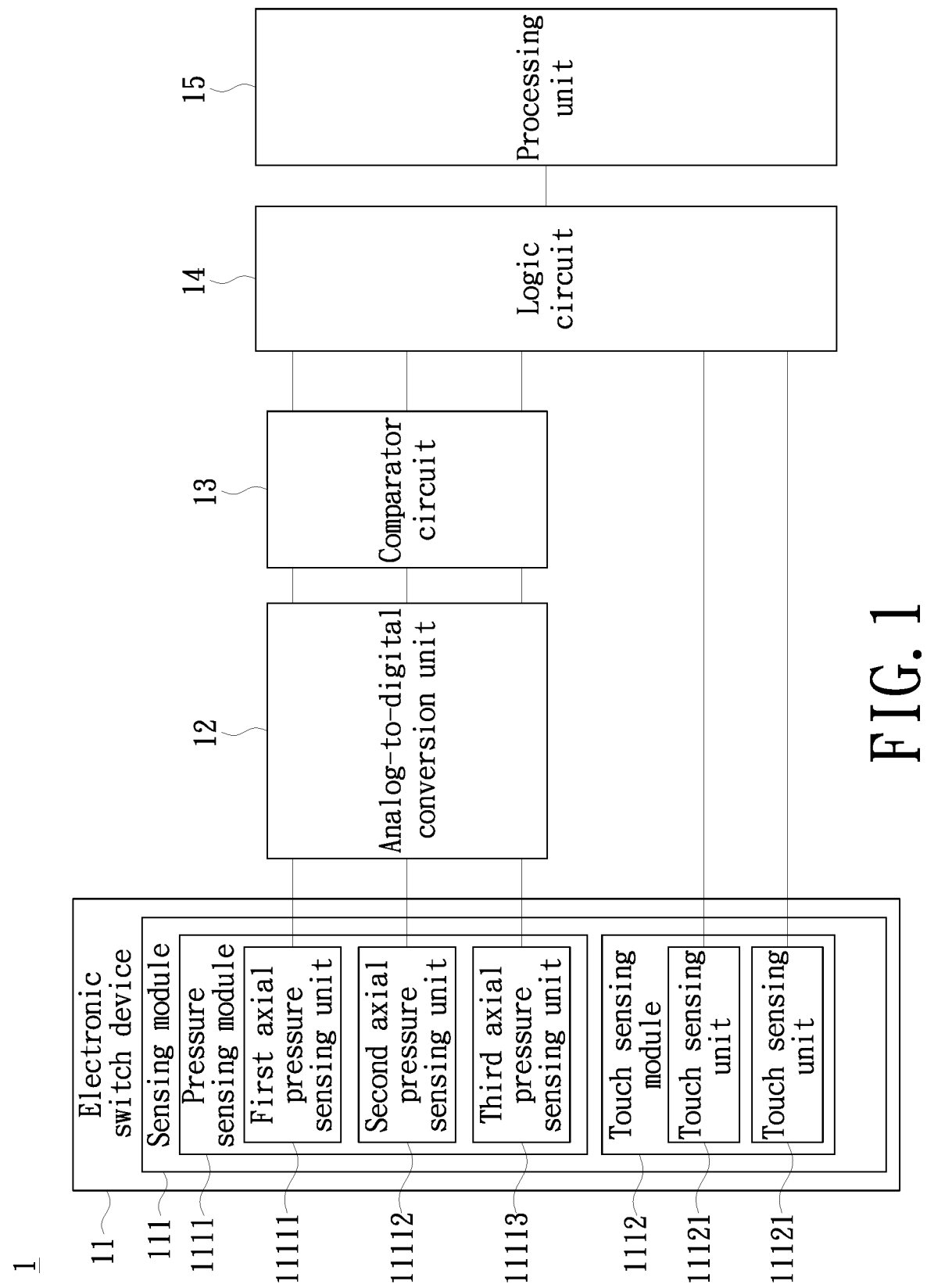
FIG. 1 is a block diagram of an electronic switch system according to an embodiment of the present invention.

Please refer to FIG. 1, which is a block diagram of an electronic switch system 1 according to an embodiment of the present invention.

In this embodiment, the electronic switch system 1 of the present invention comprises an electronic switch device 11, an analog-to-digital conversion unit 12, a comparator circuit 13, a logic circuit 14, and a processing unit 15. The electronic switch device 11 comprises a sensing module 111 that comprises a pressure sensing module 1111 and a touch sensing module 1112. The pressure sensing module 1111 comprises a first axial pressure sensing unit 11111, a second axial pressure sensing unit 11112, and a third axial pressure sensing unit 11113. The touch sensing module 1112 comprises a plurality of touch sensing units 11121. The first axial pressure sensing unit 11111, the second axial pressure sensing unit 11112 and the third axial pressure sensing unit 11113 are connected to the analog-to-digital conversion unit 12. The comparator circuit 13 is connected to the digital conversion unit 12 and the logic circuit 14. The logic circuit 14 is connected to a plurality of touch sensing units 11121 and the processing unit 15.

In this embodiment, when a user touches the electronic switch device 11, the electronic switch system 1 of the present invention can sense the user's pressing force through the pressure sensing module 1111 of the electronic switch device 11, and provide a pressure sensing signal according to the user's pressing force. The pressure sensing signal may comprise a positive pressure sensing signal and a negative pressure sensing signal. The positive pressure sensing signal is a sensing signal corresponding to the pressing positive pressure direction, and the negative pressure sensing signal is a sensing signal corresponding to the direction of pressing the negative pressure. That is, if the direction the user presses the switch is defined as the positive pressure direction, the direction the switch is pulled up is defined as the negative pressure direction. In addition, the touch sensing module 1112 arranged on the pressure sensing module 1111 may also be used to sense the position pressed currently pressed by the user. The touch sensing module 1112 comprises a plurality of touch sensing units 11121, and may provide touch sensing signals (i.e., the touch sensing signals corresponding to the position of each touch sensing unit 11121) according to the pressed positions.

In this embodiment, the pressure sensing module 1111 further comprises a first axial pressure sensing unit 11111 for providing a pressure sensing signal according to a first axial direction, a second axial pressure sensing unit 11112 for providing the pressure sensing signal according to the second axial direction, and a third axial pressure sensing unit 11113 for providing the pressure sensing signal according to the third axial direction. The first axial direction, the second axial direction and the third axial direction respectively represent directions along different axes (e.g., the X-axis direction, Y-axis direction and Z-axis direction) in the tri-axial coordinate system, and the first axial direction, the second axial direction and the third axial direction are perpendicular to one another. That is to say, the pressure sensing module 1111 can not only sense the positive pressure and negative pressure direction, but also sense the user's pressing degree in different axial directions and provide pressure sensing signals along a specific axial direction.

Next, the analog-to-digital conversion unit 12 may receive the pressure sensing signal and convert the pressure sensing signal from an analog signal to a digital signal. For example, the pressure sensing signal may be a piezoelectric analog signal generated corresponding to the deformation of the pressure sensing module 1111, and the analog-to-digital conversion unit 12 can convert the piezoelectric analog signal into a digital signal to provide a more stable pressure sensing signal to the comparator circuit 13. Next, the comparator circuit 13 may directly receive a pressure sensing signal (which is an analog signal) from the pressure sensing module 1111 or a pressure sensing signal (which is a digital signal) converted from the analog-to-digital conversion unit 12. When the pressure sensing signal is a digital signal, the comparator circuit 13 may serve as a digital comparator circuit, but the present invention is not limited thereto. The comparator circuit 13 can convert the pressure sensing signal corresponding to the user's pressing degree into a corresponding switch state, that is, the pressure sensing module 1111 can generate the pressure sensing signal according to the user's pressing degree, and the comparator circuit 13 may comprise a plurality of pressure thresholds (which can be analog signals or digital signals), and the comparator circuit 13 can generate a corresponding switch state signal by comparing the pressure sensing signal and the pressure thresholds. The switch state of the electronic switch device 11 comprises pressed positions and a plurality of switch segments, wherein the switch segments are switch states corresponding to the magnitude of the user's pressing force, and each switch segment corresponds to the strength interval of the user's pressing force, so that each time the user presses the electronic switch device 11, a switch segment corresponding to the pressing force can be provided according to the user's pressing force. In one embodiment, when the user's pressing force is too small, the output is equivalent to open circuit, that is, the switch segment is "OFF" in order to prevent the electronic switch device 11 from being touched by mistake.

Next, the logic circuit may receive the pressure sensing signal and the touch sensing signal, and determine the switch state of the electronic switch device 11 by the logic circuit according to the pressure sensing signal and the touch sensing signal (e.g., comparing/determining the analog voltage level, or directly receiving the digital signal and making the logic determination), and provide the switch state data to the processing unit 15 (the switch state data may comprise the pressed position data and the switch segment data). The processing unit 15 may determine the switch state of the electronic switch device 11 according to the switch state data, so that the electronic switch device 11 can sense the pressed position of the user and realize the multi-stage pressure sensing function. In one embodiment, the electronic switch system 1 may comprise a plurality of electronic switch devices 11, and the switch state of each electronic switch device 11 is provided to the processing unit 15 through the above structure.

Next, referring to FIGS. 2 to 4, the arrangements and implementation structures of the pressure sensing module 1111 and the touch sensing module 1112 will be described below.

The present invention provides various embodiments. In various embodiments of the present invention, a component/device assigned with the same symbol used in another embodiment suggests that it may also comprise the same functions as described in said other embodiments, and thus the detailed description thereof will be repeated, and only the feature distinguishing other embodiments will be described. The matters mentioned in various embodiments can be rearranged, combined and applied to various embodiments as long as there is no conflict, and the scope of the present invention is not limited to the introduced embodiments.

In the present invention, the pressure sensing module 1111 refers to a device/component for sensing the pressing force of a user and providing a pressure sensing signal. For example, the pressure sensing module 1111 may comprise piezoelectric materials, and the mechanical energy is converted into electrical energy by the deformation of the material, but the present invention is not limited here. The devices/components that can provide pressure sensing signals according to the user's pressure can be used as the pressure sensing module 1111 of the present invention. In addition, the present invention is not limited to the listed embodiments. The pressure sensing module 1111 may comprise a first axial pressure sensing unit 11111, a second axial pressure sensing unit 11112 and a third axial pressure sensing unit 11113, which are respectively used to sense the user's pressing force and provide respective pressure sensing signals along the first axial direction, the second axial direction, and the third axial direction (e.g., the X-axis direction, Y-axis direction, and Z-axis direction) according to the pressing force.

In the present invention, the touch sensing module 1112 refers to a device arranged on the pressure sensing module 1111 to sense the pressing position of a user by a plurality of touch sensing units 11121 and to provide a touch sensing signal. The way the touch sensing module 1112 is arranged on the pressure sensing module 1111 may be in an overlapped or attached manner, but the present invention is not limited thereto. The arrangement of the touch sensing module 1112 is not particularly limited, but should at least meet following two conditions: the touch sensing module 1112 should be arranged on the pressure sensing module 1111; and the pressure sensing function of the pressure sensing module 1111 should be normally operational. For example, the touch sensing module 1112 can sense the user's pressing position with, for example, a capacitive sensor, optical sensor and ultrasonic sensor. The touch sensing unit 11121 can be a sensing electrode or a sensing device/element that can sense the user's pressing position, but the present invention is not limited thereto. Any sensing device/element that can sense the user's pressing position can be implemented as the touch sensing module 1111 of the present invention.

Figure 2:
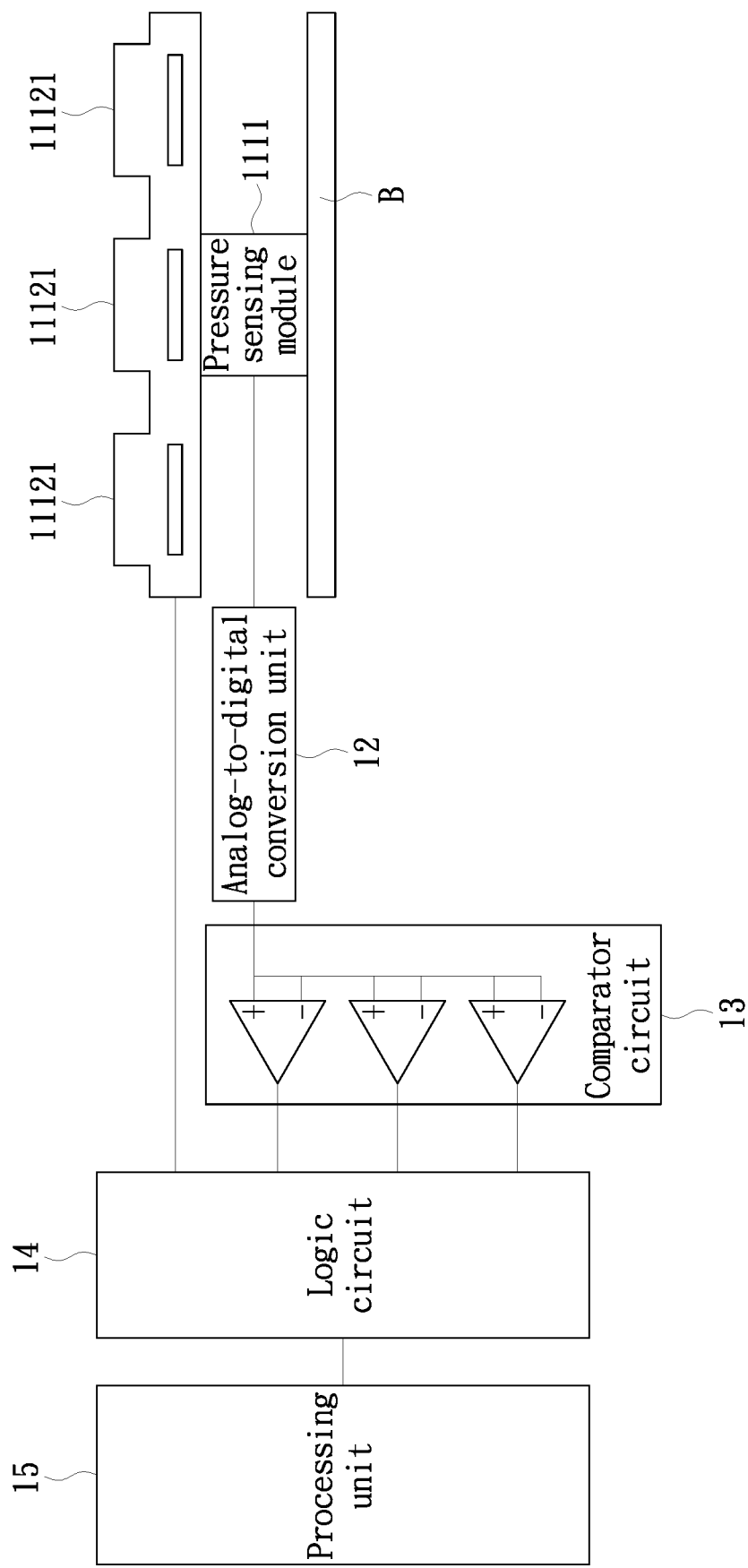
FIG. 2 is a diagram illustrating the structure of an electronic switch device according to an embodiment of the present invention.

Please refer to FIG. 2, which is a diagram illustrating the structure of an electronic switch device according to an embodiment of the present invention.

In FIG. 2, a pressure sensing module 1111 is arranged on a substrate, a touch sensing module 1112 is arranged on the pressure sensing module 1111, and a plurality of touch sensing units 11121 are distributed in the touch sensing module 1112. The pressure sensing module 1111 is connected with the analog-to-digital conversion unit 12, and the touch sensing module 1112 is connected with the logic circuit 14. For example, when a user touches the touch sensing module 1112 with a finger, among a plurality of the touch sensing units 11121 in the touch sensing module 1112, part of the touch sensing units 11121 may provide a touch sensing signal to the logic circuit 14 (i.e., the touch sensing unit 11121 in contact with the finger). In addition, during the process of touching the touch sensing module 1112 with a finger, the finger provides a pressing force, thus making the pressure sensing module 1111 deformed and provides a pressure sensing signal. The pressure sensing signal is provided to the logic circuit 14 via the analog-to-digital conversion unit 12 and the comparator circuit 13. Therefore, the logic circuit 14 can provide the switch state data to the processing unit 15 according to the touch sensing signal corresponding to the finger contact position provided by the touch sensing module 1112 and the pressure sensing signal provided by the pressure sensing module 1111, so that the processing unit 15 can determine the switch state of the electronic switch device 11 by the switch state data.

Figure 3:
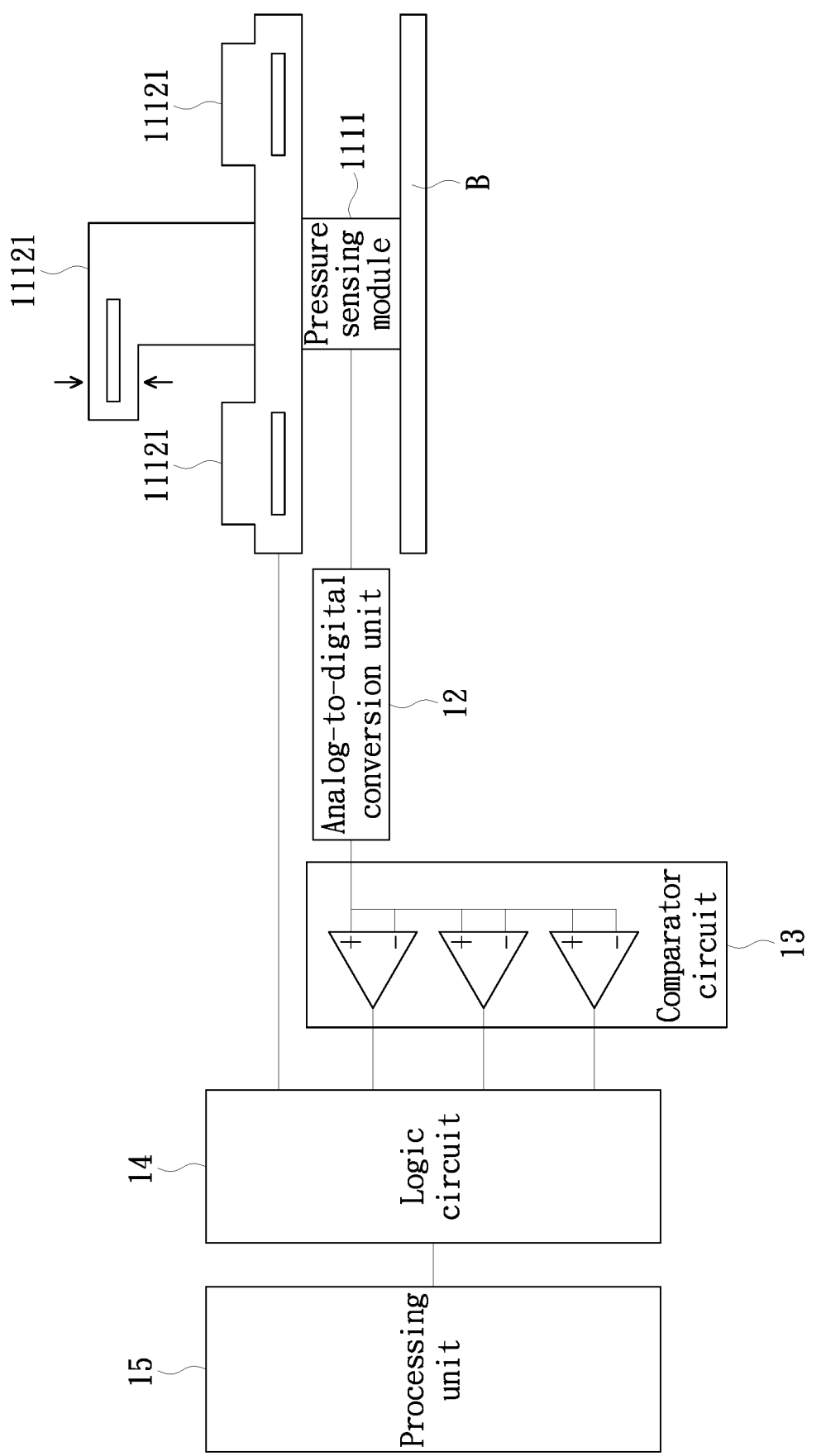
FIG. 3 is a diagram illustrating the structure of an electronic switch device according to another embodiment of the present invention.

Please refer to FIG. 3, which is a diagram illustrating the structure of an electronic switch device according to another embodiment of the present invention.

In the embodiment of FIG. 3, although the touch sensing module 1112 is also arranged on the pressure sensing module 1111, the touch sensing module 1112 is now implemented in a non-planar manner, which is different from the embodiment of FIG. 2. That is, in this embodiment, the touch sensing module 1112 may include a convex structure that provides the advantage of being easily combined or connected with other mechanical structures, and may also allow the pressure sensing module 1111 to more easily sense the positive/negative pressure pressing direction of the user and accordingly provide a positive/negative sensing signal, as indicated by the arrows in FIG. 3. In addition, the convex structure also allows for blind operations. Different from the conventional touch switch, the touch sensing module 1112 of the present invention may further adopt the above-mentinoed convex structure, so that the user can operate the touch sensing module 1112 without watching it at the same time.

Figure 4:
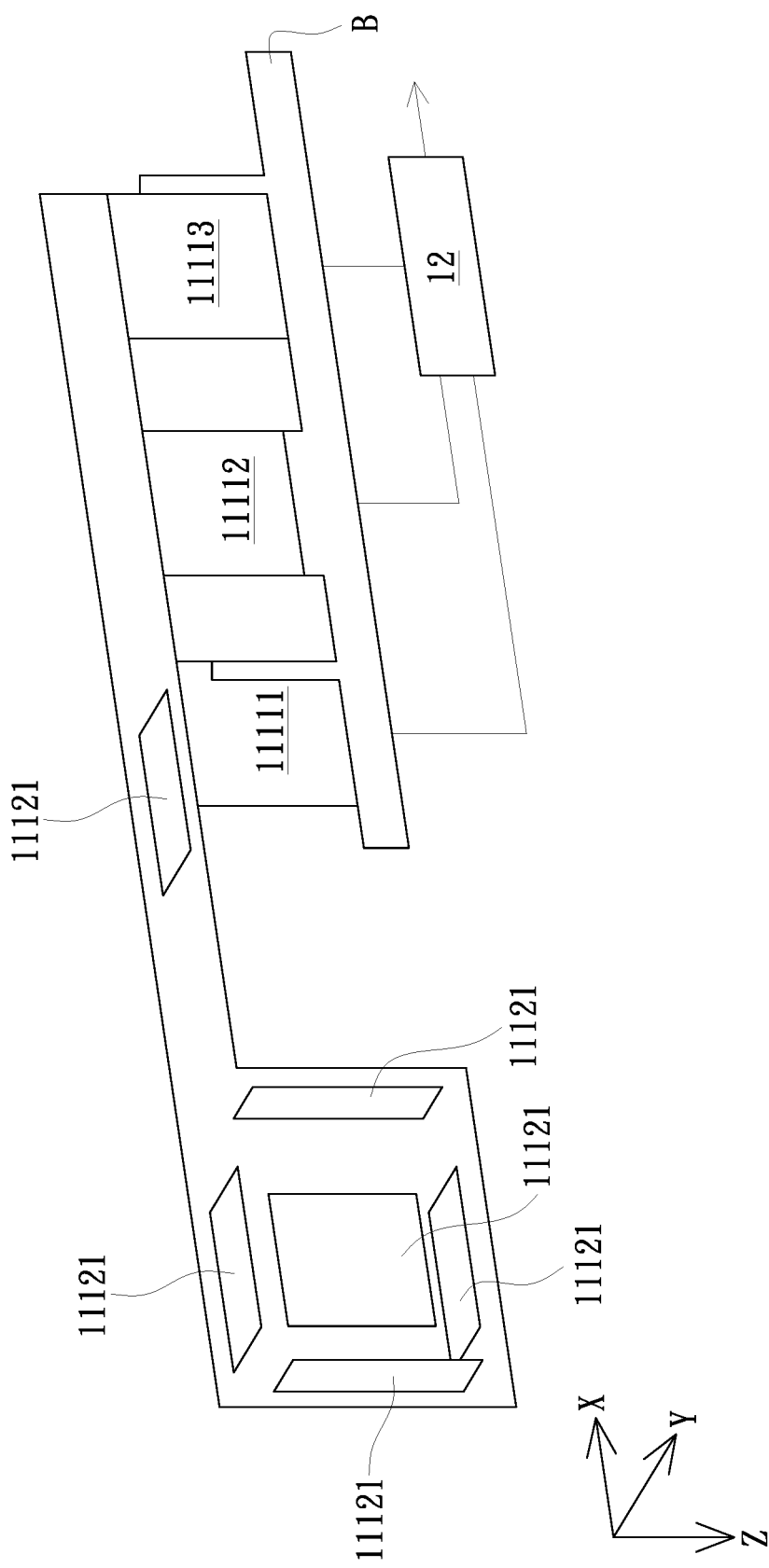
FIG. 4 is a diagram illustrating the structure of an electronic switch device according to yet another embodiment of the present invention.

Please refer to FIG. 4, which is a diagram illustrating the structure of an electronic switch device according to yet another embodiment of the present invention.

In the embodiment of FIG. 4, the pressure sensing module 1111 and the touch sensing module 1112 can be arranged in the first axial direction, the second axial direction and the third axial direction (e.g., the X-axis direction, the Y-axis direction and the Z-axis direction shown in FIG. 4).

The sensing surface of the touch sensing unit 11121 may be placed in accordance with the first axial direction, second axial direction and third axial direction respectively, to sense the pressing position of the user. Further, a substrate B may be provided for the first axial (which may be corresponding to the Y-axis direction) pressure sensing unit 11111, the second axial (which may be corresponding to the Z-axis direction) pressure sensing unit 11112 and the third axial (which may be corresponding to the X-axis direction) pressure sensing unit 11113, and the sensing surface of the touch sensing unit 11121 may be used to sense the user's pressing force, wherein the first axial pressure sensing unit 11111 can respectively sense the pressing force along the positive/negative direction of the Y axis, the second axial pressure sensing unit 11112 can respectively sense the pressing force along the positive/negative direction of the Z axis, and the third axial pressure sensing unit 11113 can respectively sense the pressing force along the positive/negative direction of the X axis.

Next, an application of the electronic switch device 11/electronic switch system 1 of the present invention will be described as follows.

For example, the electronic switch device 11/electronic switch system 1 of the present invention can be applied to a rocker controller. With the above-introduced architecture of the present invention, the rocker controller may have multi-axial linear pressure sensing functions, and keys of the rocker controller may have composite touch and pressure sensing functions.

For example, the electronic switch device 11/electronic switch system 1 of the present invention can be applied to hand-held personal appliances, such as electric toothbrushes, electric razors, etc. With the above structure of the present invention, the key function of the hand-held personal appliance cannot be disabled due to water exposure. If the conventional touch switch is used in the situation where it could be exposed to water, as the key function of the touch switch may be disabled due to water exposure, etc. On the contrary, the electronic switch device 11/electronic switch system 1 of the present invention further includes the pressure sensing function, so that the key function will not be disabled due to water exposure, and the user can operate the electronic switch device 11/electronic switch system 1 using the pressure sensing function. In one embodiment, the user may further use the touch function to decide whether to start the pressure sensing function. In another embodiment, the electronic switch device 11/electronic switch system 1 may start counting a time period after the user's hand leaves the touch sensing module 1112, so as to delay turning off the power of the corresponding hand-held personal appliance.

Specifically, the electronic switch device 11/electronic switch system 1 of the present invention can be applied to the electric window control system of an automobile. For example, by combining the electric window control system of an automobile with the multi-section pressure sensing function provided by the present invention, a user can control the opening and closing of a specific window in the positive/negative pressure direction via a first switch segment in the switch state. Further, the function of automatically opening and closing a specific window with one key can be realized by the second switch segment in the switch state. Moreover, the function of automatically opening and closing all windows with one key can be realized by the third switch segment in the switch state.

For example, the electronic switch device 11/electronic switch system 1 of the present invention can be applied to an elevator control panel. Because the touch sensing module 1112 of the present invention is arranged on the surface of the electronic switch device 11, the electronic switch device 11 of the present invention can be applied to the elevator control panel in a seamless manner. Further, as there is no seam between the electronic switch device 11 and the elevator control panel, the elevator control panel can be directly cleaned and sanitized with alcohol/disinfectant. In addition, when a cleaning person is cleaning, the electronic switch device 11 will not be accidentally touched by the cleaning person during the cleaning process due to the above-mentioned pressure sensing function, and thus the electronic switch device 11 can provide the technical effect of preventing accidental touch.

To sum up, the electronic switch device and the electronic switch system provided of the present invention can provide a pressure sensing signal and a touch sensing signal respectively via the pressure sensing module and the touch sensing module when the user touches the electronic switch device, and then transmit the pressure sensing signal to the comparator circuit to realize the touch function as well as multi-stage pressure sensing function. According to the technical structure, the invention realizes the multi-stage pressure sensing function, while the problem of mechanical loss and reduced service life caused by using mechanical switches alone can be avoided, and the problem of the raised difficulty of simulating the pressure sensing function due to using touch switches alone can be also avoided. The design of the sensing module of the invention combines the touch sensing module and the pressure sensing module, thus eliminating the problem of mechanical loss and extending the service life. Because the design of the sensing module combines the touch sensing module and the pressure sensing module, the pressing contact surface of the electronic switch can be realized in a seamless manner, and the electronic switch is provided with the technical effects of waterproof, mistouch prevention, blind operation, multi-directional pressure sensing, etc.

Although the present invention has been disclosed by way of example, it is not intended to limit the present invention. As those skilled in the art to which the present invention belongs can make some changes and embellishments without departing from the spirit and scope of the present invention, the claimed scope of the present invention shall be determined based on the appended claims.

What is claimed is:

1. An electronic switch device, comprising:
   a sensing module comprising:
      a pressure sensing module arranged to provide a pressure sensing signal; and
      a touch sensing module arranged on the pressure sensing module and to provide a touch sensing signal;
   wherein the sensing module is coupled with a comparator circuit, and the comparator circuit receives the pressure sensing signal.

2. The electronic switch device of claim 1, wherein the pressure sensing signal comprises a positive pressure sensing signal and a negative pressure sensing signal.

3. The electronic switch device according to claim 1, wherein the pressure sensing module comprises:
   a first axial pressure sensing unit arranged to provide the pressure sensing signal according to a first axial direction;
   a second axial pressure sensing unit arranged to provide the pressure sensing signal according to a second axial direction; and
   a third axial pressure sensing unit arranged to provide the pressure sensing signal according to a third axial direction;
   wherein the first axial direction, the second axial direction and the third axial direction are perpendicular to one another.

4. The electronic switch device of claim 1, wherein the sensing module is connected to an analog-to-digital conversion unit, and the analog-to-digital conversion unit receives the pressure sensing signal and converts the pressure sensing signal from an analog signal to a digital signal.

5. The electronic switch device according to claim 1, wherein the sensing module is coupled to a logic circuit, and the logic circuit receives the pressure sensing signal and the touch sensing signal, and is used to provide a switch state data.

6. An electronic switch system comprising:
   an electronic switch device comprising:
      a sensing module comprising:
         a pressure sensing module arranged to provide a pressure sensing signal; and
         a touch sensing module arranged on the pressure sensing module to provide a touch sensing signal; and
      a comparator circuit coupled to the sensing module, and arranged to receive the pressure sensing signal.

7. The electronic switch system according to claim 6, wherein the pressure sensing signal comprises a positive pressure sensing signal and a negative pressure sensing signal.

8. The electronic switch system according to claim 6, wherein the pressure sensing module comprises:
   a first axial pressure sensing unit arranged to provide the pressure sensing signal according to a first axial direction;
   a second axial pressure sensing unit arranged to provide the pressure sensing signal according to a second axial direction; and
   a third axial pressure sensing unit arranged to provide the pressure sensing signal according to a third axial direction;
   wherein the first axial direction, the second axial direction and the third axial direction are perpendicular to one another.

9. The electronic switch system according to claim 6, comprising:
   an analog-to-digital conversion unit connected to the sensing module, and arranged to receive the pressure sensing signal and convert the pressure sensing signal from an analog signal to a digital signal.

10. The electronic switch system according to claim 6, comprising:
    a logic circuit coupled to the sensing module, and arranged to receive the pressure sensing signal and the touch sensing signal and provide a switch state data.

* * * * *